(12) United States Patent
Kawakita et al.

(10) Patent No.: US 6,174,589 B1
(45) Date of Patent: Jan. 16, 2001

(54) PRINTED CIRCUIT BOARD AND METHOD FOR PRODUCING THE SAME

(75) Inventors: Yoshihiro Kawakita; Seiichi Nakatani; Masakazu Tanahashi, all of Osaka (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/159,376

(22) Filed: Sep. 23, 1998

Related U.S. Application Data

(62) Division of application No. 08/959,154, filed on Oct. 28, 1997.

(30) Foreign Application Priority Data

Nov. 8, 1996 (JP) .................................................. 8-296651

(51) Int. Cl.⁷ ...................................................... B32B 3/00
(52) U.S. Cl. ........................... 428/209; 428/901; 174/258
(58) Field of Search ................................... 174/250, 255, 174/258; 428/209, 901

(56) References Cited

U.S. PATENT DOCUMENTS

| | | | |
|---|---|---|---|
| 4,690,854 | * 9/1987 | Tomibe et al. | 428/209 |
| 4,734,299 | * 3/1988 | Matuzaki et al. | 427/304 |
| 5,569,545 | * 10/1996 | Yokono et al. | 428/626 |
| 5,589,250 | 12/1996 | Asai et al. | 428/209 |
| 5,851,646 | * 12/1998 | Takahashi et al. | 428/294.1 |

FOREIGN PATENT DOCUMENTS

| | | |
|---|---|---|
| 58-176993 | 10/1983 | (JP) . |
| 5-53080 | 8/1993 | (JP) . |
| 6-37447 | 2/1994 | (JP) . |
| 6-37452 | 2/1994 | (JP) . |
| 6-158492 | 6/1994 | (JP) . |
| 7-314603 | 12/1995 | (JP) . |

* cited by examiner

*Primary Examiner*—Cathy Lam
(74) *Attorney, Agent, or Firm*—Merchant & Gould P.C.

(57) ABSTRACT

A printed circuit board includes insulating layers formed by impregnating a base material with a resin and a metal foil pattern formed on a desired layer of the insulating layers. Ions for forming a hardly soluble metal salt by combining with metal ions free from a portion of the board or a sulfur-containing compound for reacting with the metal ion are present in the insulating layer or on a surface of the metal foil pattern. Furthermore, a method for producing the printed circuit board includes any one of the steps of adding the ions or the sulfur-containing compound to the resin varnish, impregnating a base material with the solution of the ions or the sulfur-containing compound, or applying the solution onto the surface of the metal foil pattern, in order to allow the ions or the sulfur-containing compound to exist in the printed circuit board.

13 Claims, No Drawings

PRINTED CIRCUIT BOARD AND METHOD FOR PRODUCING THE SAME

This application is a Divisional of application Ser. No. 08/959,154, filed Oct. 28, 1997, now allowed which application(s) are incorporated herein by reference.

FIELD OF THE INVENTION

The present invention relates to a printed circuit board excellent in suppressing ion migration causing a dielectric breakdown, and a method for producing the same.

BACKGROUND OF THE INVENTION

As the miniaturization, the light weight and the high performance of electronic equipment have been successfully pursued in recent years, the miniaturization, the light weight, the high speed signal processing and the implementation at a high density of a printed circuit board are in increasing demand. The printed circuit board technique responds to such a demand by accelerating the formation of a larger number of layers, smaller via holes and finer circuitry. In particular, with the development of the finer circuitry, the gap between lines and via holes is reduced, so that dielectric breakdown can be caused readily due to ion migration. The ion migration is an electrolytic function, referring to a phenomenon in which an electrolyte between metals to which a voltage is applied, the metal at the anode is eluted, moves to the cathode and is precipitated. Since this phenomenon is based on an electrochemical function, it is required that ions flow between the metals. The ion migration in the printed circuit board is generally effected in the following manner: a path of water is generated due to the absorption of moisture at the interface between an impregnated resin and a base material, in foreign fibers attached to a circuit pattern, in cracks in an insulating layer, or the like, and an ion current flows in the path.

A number of methods for preventing the ion migration in the printed circuit board were conventionally proposed, such as a method of making a metal into an alloy in order to suppress the ionization of the metal and a method of adding a reducing agent to the board. Another method of adding a chelating agent to the board in order to capture eluted metal ions was proposed.

However, the aforementioned methods are not necessarily satisfactory as a measure to counter the ion migration in view of the cost and the performance. For example, the cost of producing an alloy is high because expensive palladium is used. Furthermore, for the reducing agent, an aldehyde, hydroquinon, hydrazine or the like is often used. Disadvantageously, they are chemically unstable and are readily degraded by heat or light. Similarly, the chelating agent is likely to be degraded or deactivated by heat.

Furthermore, in addition to the formation of a finer circuitry, the formation of the printed circuit board of a larger number of layers is accelerated. For this reason, more and more boards are formed of an inexpensive and light-weight resin or an inexpensive nonwoven fabric. The resin board generally has a relatively high hygroscopicity, and thus the ion migration is likely to be caused. Furthermore, when a glass or a nonwoven fabric such as aramid is used as the base material, an impregnated resin is unlikely to exist between the base material and a metal foil. This means that a base material fabric not coated with a resin, or a foreign fabric that easily absorbs moisture such as cellulose or the like, is directly in contact with the metal foil. Thus, a path of water is generated due to the absorption of moisture by the board, and then the ion migration is caused. Thus, a printed circuit board having improved resistance to ion migration is significantly desired.

SUMMARY OF THE INVENTION

A printed circuit board of the present invention includes insulating layers formed by impregnating a base material (substrate) with a resin and a metal foil pattern formed on a desired layer of the insulating layers. Ions for forming a hardly soluble metal salt by combining with metal ions free from a portion of the board are present in the insulating layer or on a surface of the metal foil pattern.

In one embodiment, the ions to be combined with the free metal ions are sulfide ions.

In another embodiment, the sulfide ions are supplied from at least one selected from the group consisting of ammonium sulfide, potassium sulfide and sodium sulfide.

In still another embodiment, a solubility product of the hardly soluble metal salt in water (at 25° C.) is in the range from $10^{-40}$ to $10^{-10}$.

In yet another embodiment, an addition amount of a sulfide compound for supplying ions to be combined with the free metal ions is in the range from 0.001 wt % to 0.1 wt % on the basis of the total weight of the board.

In another embodiment, the metal foil pattern is formed of at least one metal selected from the group consisting of copper, silver and nickel.

In still another embodiment, the base material is at least one selected from the group consisting of a glass woven fabric, a glass nonwoven fabric, an aramid woven fabric, an aramid nonwoven fabric and an aramid film.

In yet another embodiment, the resin to be impregnated is at least one resin selected from the group consisting of an epoxy resin, a cyanate ester resin, a bismaleimide triazine resin, a polyimide resin, and a polyphenylene oxide (PPO) resin.

According to another aspect of the printed circuit board of the present invention including insulating layers formed by impregnating a base material with a resin and a metal foil pattern formed on a desired layer of the insulating layers, a sulfur-containing compound for reacting with metal ions free from a portion of the board is present in the insulating layer or on a surface of the metal foil pattern.

In one embodiment, the sulfur-containing compound to react with the free metal ions is thiourea.

In another embodiment, an addition amount of the sulfur-containing compound for reacting with the free metal ions is in the range from 10 ppm to 10000 ppm.

According to another aspect of the present invention, a method for producing a printed circuit board includes the steps of, impregnating a base material with a resin varnish containing ions for forming a hardly soluble metal salt by combining with metal ions free from a portion of a board and drying so as to form a prepreg; laminating metal foils on the prepreg to be bonded under thermocompression; and forming a circuit pattern on the metal foil.

In one embodiment, the ions to be combined with the free metal ions are sulfide ions.

In another embodiment, the sulfide ions are supplied from at least one selected from the group consisting of ammonium sulfide, potassium sulfide and sodium sulfide.

In still another embodiment, a solubility product of the hardly soluble metal salt in water (at 25° C.) is in the range from $10^{-40}$ to $10^{-10}$.

According to another aspect of the present invention, a method for producing a printed circuit board includes the steps of: immersing a base material into a solution containing ions for forming a hardly soluble metal salt by combining with metal ions free from a portion of a board and drying; impregnating the base material with a resin varnish and drying so as to form a prepreg; laminating metal foils on the prepreg to be bonded under thermocompression; and forming a circuit pattern on the metal foil.

In one embodiment, the ions to be combined with the free metal ions are sulfide ions.

In another embodiment, the sulfide ions are supplied from at least one selected from the group consisting of ammonium sulfide, potassium sulfide and sodium sulfide.

In still another embodiment, a solubility product of the hardly soluble metal salt in water (at 25° C.) is in the range from $10^{-40}$ to $10^{-10}$.

In yet another embodiment, the metal is at least one metal selected from the group consisting of copper, silver and nickel.

In another embodiment, the base material is at least one selected from the group consisting of a glass woven fabric, a glass nonwoven fabric, an aramid woven fabric, an aramid nonwoven fabric and an aramid film.

In still another embodiment, the resin to be impregnated is at least one resin selected from the group consisting of an epoxy resin, a cyanate ester resin, a bismaleimide triazine resin, a polyimide resin, and a polyphenylene oxide (PPO) resin.

According to another aspect of the present invention, a method for producing a printed circuit board includes the steps of: applying a solution containing ions for forming a hardly soluble metal salt by combining with metal ions free from a portion of a board onto a surface of a metal foil pattern of a printed circuit board including two or more layers and drying; laminating a base material impregnated with a resin on the printed circuit board; further laminating metal foils on the laminate to be bonded under thermocompression; and forming a circuit pattern on the metal foil.

In one embodiment, the ions to be combined with the free metal ions are sulfide ions.

In another embodiment, the sulfide ions are supplied from at least one selected from the group consisting of ammonium sulfide, potassium sulfide and sodium sulfide.

In still another embodiment, a solubility product of the hardly soluble metal salt in water (at 25° C.) is in the range from $10^{-40}$ to $10^{-10}$.

According to another aspect of the present invention, a method for producing a printed circuit board includes the steps of: impregnating a base material with a resin varnish containing a sulfur-containing compound for reacting with metal ions free from a portion of a board and drying so as to form a prepreg; laminating metal foils on the prepreg to be bonded under thermocompression; and forming a circuit pattern on the metal foil.

In one embodiment, the sulfur-containing compound to react with the free metal ions is thiourea.

In another embodiment, the metal is at least one metal selected from the group consisting of copper, silver and nickel.

In still another embodiment, the base material is at least one selected from the group consisting of a glass woven fabric, a glass nonwoven fabric, an aramid woven fabric, an aramid nonwoven fabric and an aramid film.

In yet another embodiment, the resin to be impregnated is at least one resin selected from the group consisting of an epoxy resin, a cyanate ester resin, a bismaleimide triazine resin, a polyimide resin, and a polyphenylene oxide (PPO) resin.

According to another aspect of the present invention, a method for producing a printed circuit board includes the steps of: immersing a base material into a solution containing a sulfur-containing compound for reacting with metal ions free from a portion of a board and drying; impregnating the base material with a resin varnish and drying so as to form a prepreg; laminating metal foils on the prepreg to be bonded under thermocompression; and forming a circuit pattern on the metal foil.

In one embodiment, the sulfur-containing compound to react with the free metal ions is thiourea.

In another embodiment, the metal is at least one metal selected from the group consisting of copper, silver and nickel.

In still another embodiment, the base material is at least one selected from the group consisting of a glass woven fabric, a glass nonwoven fabric, an aramid woven fabric, an aramid nonwoven fabric and an aramid film.

In yet another embodiment, the resin to be impregnated is at least one resin selected from the group consisting of an epoxy resin, a cyanate ester resin, a bismaleimide triazine resin, a polyimide resin, and a polyphenylene oxide (PPO) resin.

According to another aspect of the present invention, a method for producing a printed circuit board includes the steps of: applying a solution containing a sulfur-containing compound for reacting with metal ions free from a portion of a board onto a surface of a metal foil pattern of a printed circuit board including two or more layers, and drying; laminating a base material impregnated with a resin on the printed circuit board; further laminating metal foils on the laminate to be bonded under thermocompression; and forming a circuit pattern on the metal foil.

In one embodiment, the sulfur-containing compound to react with the free metal ions is thiourea.

In another embodiment, the metal is at least one metal selected from the group consisting of copper, silver and nickel.

In still another embodiment, the base material is at least one selected from the group consisting of a glass woven fabric, a glass nonwoven fabric, an aramid woven fabric, an aramid nonwoven fabric and an aramid film.

In yet another embodiment, the resin to be impregnated is at least one resin selected from the group consisting of an epoxy resin, a cyanate ester resin, a bismaleimide triazine resin, a polyimide resin, and a polyphenylene oxide (PPO) resin.

Thus, the invention described herein makes possible the advantages of (1) providing a printed circuit board that excels in suppressing ion migration by depositing the metal ions eluted in the board using ions forming a hardly soluble metal salt in combination with the metal ions or reacting the metal ions with a sulfur-containing compound; and (2) providing a method for producing the same.

These and other advantages of the present invention will become apparent to those skilled in the art upon reading and understanding the following detailed description.

DESCRIPTION OF THE PREFERRED EMBODIMENTS

The printed circuit board of the present invention has a basic structure in which a base material is impregnated with a resin so as to form insulating layers, and a metal foil pattern is formed on a desired layer of the insulating layers. Then, ions for forming a hardly soluble metal salt in combination with free metal ions, or a sulfur-containing compound for reacting with the metal ions, are present in the insulating layers or on the surface of the metal foil pattern on the desired layer.

As described above, the ion migration is the phenomenon where, when a voltage is applied across metal electrodes having an electrolyte therebetween, metal ions are eluted and move from the anode to the cathode.

According to the present invention, the metal ions eluted by applying a voltage can be captured and deposited by adding ions for forming a hardly soluble metal salt in combination with the metal ions free from a portion of the board. As a result, the ion migration can be suppressed effectively.

However, the solubility product of the deposited salt in water (at 25° C.) is preferably $10^{-10}$ or less. In the case where the solubility product is larger than $10^{-10}$, the metal ions cannot be captured effectively by the added ions. Therefore, an ion current becomes large, leading to a possibility of facilitating the ion migration. As the ions to be added, sulfide ions are preferable. As a vehicle for supplying the ions, ammonium sulfide, sodium sulfide, potassium sulfide or the like are preferable. Alternatively, hydroxide ions may be added. The addition amount of the ions is preferably 0.1 wt % or less on the basis of the total weight of the board. In the case where the addition amount is larger than 0.1 wt %, electric characteristics such as the break down voltage of the board or the like can deteriorate.

Furthermore, the metal ions eluted by applying a voltage can be captured by adding a sulfur-containing compound for reacting with the metal ions (so as to generate a complex or a deposit). As a result, the ion migration can be suppressed effectively. As the sulfur-containing compound to be added, thiourea is preferable. The thiourea reacts with metal ions and water molecules in water so as to generate urea and a sulfide of a metal. Therefore, the thiourea provides the same effect as the sulfide ions described above. Furthermore, the addition amount of the sulfur-containing compound is preferably 10 ppm or more on the basis of the total weight of the board. In the case where the addition amount is smaller than 10 ppm, the proportion of the metal ions moving from one electrode to another to the metal ions reacting with the sulfur-containing compound is large, so that an effect of suppressing the ion migration cannot be obtained. Furthermore, the same effect can be obtained, when a resin to which a thiourea group is incorporated is used as the impregnated resin.

Furthermore, in the printed circuit board with the above-mentioned structure, at least any one of copper, silver and nickel can be used for the metal foil pattern.

Furthermore, in the printed circuit board with the above-mentioned structure, at least any one of a glass fabric, a glass nonwoven fabric, an aramid woven fabric, an aramid nonwoven fabric, an aramid film and all aromatic polyesters can be used for the base material.

Furthermore, in the printed circuit board with the above-mentioned structure, the resin to be impregnated is formed by mixing at least any one of an epoxy resin, a cyanate ester resin, a bismaleimide triazine resin, a polyimide resin, and a polyphenylene oxide (PPO) resin The method for producing the printed circuit board of the present invention includes at least the steps of impregnating a base material with a resin varnish to which ions for forming a hardly soluble metal salt in combination with metal ions or a sulfur-containing compound for reacting with the metal ions are added, and drying it so as to form a prepreg, laminating metal foils on the prepreg and bonding them under thermocompression, and forming a circuit pattern on the metal foils. This method allows the substances that can capture the metal ions eluted by the application of a voltage to exist in the insulating layer of the printed circuit board with the above-mentioned structure, thus resulting in the suppression of the ion migration. An impregnated resin to which a thiourea group is incorporated can be used for the varnish.

Furthermore, the method for producing the printed circuit board of the present invention includes at least the steps of immersing a base material into a solution containing ions for forming a hardly soluble metal salt in combination with metal ions or a sulfur-containing compound for reacting with the metal ions and drying it, impregnating the base material with a resin varnish and drying it so as to form a prepreg, laminating metal foils on the prepreg and bonding them under thermocompression, and forming a circuit pattern on the metal foils. This method allows the substances for capturing the metal ions eluted by the application of a voltage to be previously attached to the base material, so that they exist in the insulating layer of the printed circuit board with the above-mentioned structure or on the surface of the base material, thus resulting in the suppression of the ion migration. A preferable method for attaching the ions or the sulfur-containing compound to the base material includes impregnating the base material with the solution of the ions or the sulfurcontaining compound. Alternatively, the solution may be sprayed on the base material. As the solvent of the solution, water and alcohols are preferable.

Furthermore, the method for producing the printed circuit board of the present invention includes at least the steps of applying a solution containing ions for forming a hardly soluble metal salt in combination with metal ions, or a sulfur-containing compound for reacting with the metal ions, onto the surface of the metal foil pattern of a printed circuit board including two or more layers and drying it, laminating a base material impregnated with a resin on the printed circuit board, laminating metal foils on the laminate and bonding them under thermocompression, and forming a circuit pattern on the metal foil. This method allows the substances for capturing the metal ions eluted by the application of a voltage to exist on the surface of the metal foil pattern of the printed circuit board, thus resulting in the suppression of the ion migration. A preferable method for attaching the ions or the sulfur-containing compound to the metal foil pattern includes dipping the printed circuit board into the solution of the ions or the sulfurcontaining compound. Alternatively, the solution may be sprayed on the surface of the printed circuit board. As the solvent of the solution, water and alcohols are preferable.

In the above-mentioned methods for producing the printed circuit board, when the metal and the ions form a hardly soluble metal salt in the board, the solubility product of the hardly soluble metal salt in water (at 25° C.) is preferably $10^{-10}$ or less. In the case where the solubility product is larger than $10^{-10}$, the ion migration cannot be suppressed, as described above. As the ions, sulfide ions are preferable. As a vehicle for supplying the ions, ammonium sulfide, sodium sulfide, potassium sulfide or the like are preferable. Alternatively, hydroxide ions may be used as the ions. As a vehicle for supplying the hydroxide ions, sodium hydroxide, potassium hydroxide or the like is preferable. As the sulfur-containing compound to react with the metal ions, thiourea is preferable.

Furthermore, in the printed circuit board with the above-mentioned structure, at least any one of copper, silver and nickel can be used for the metal foil pattern.

Furthermore, in the methods for producing the printed circuit board with the above-mentioned structure, at least any one of a glass fabric, a glass nonwoven fabric, an aramid woven fabric, an aramid nonwoven fabric, an aramid film and all aromatic polyesters can be used for the base material.

Furthermore, in the methods for producing the printed circuit board with the above-mentioned structure, the resin to be impregnated is formed by mixing at least any one of an epoxy resin, a cyanate ester resin, a bismaleimide triazine resin, a polyimide resin and a PPC resin.

EXAMPLES

Hereinafter, the present invention will be described by way of examples. In the examples below, "parts" refers to parts by weight.

Comparative Example 1

An aramid nonwoven fabric (manufactured by Teijin Ltd.: Technora) is impregnated with a resin varnish containing 30 parts of brominated bisphenol A type epoxy resin, 35 parts of trifunctional epoxy region, 30 parts of novolac type phenol resin, 0.1 parts of carbonyldiimidazole and 67 parts of methyl ethyl ketone, and dried so as to form a prepreg. The amount of the resin to be impregnated is 50±1 wt % on the basis of the total weight of the prepreg, and the drying is performed at 140° C. for 3 minutes. Then, a predetermined portion of the prepreg is subjected to a via processing to open a hole in the thickness using a carbon dioxide laser, and the hole (via) is filled with a conductive paste. The conductive paste is formed of copper powder with an average diameter of 2 μm as a conductive substance and a solventless type epoxy resin as a binder resin. The content of the copper powder is 85 wt %. The conductive paste is formed by kneading the copper powder and the binder resin with three rolls. The prepreg filled with the conductive paste is sandwiched by copper foils, and pressed by a hot press under vacuum at 200° C., 55 kg/cm² for 1 hour. Thereafter, a circuit pattern for an inner layer is formed by etching, thus producing a double face plate. Then, the double face plate is sandwiched by the prepreg which has been subjected to a via processing at its predetermined portion by the carbon dioxide laser and whose via holes are filled with the conductive paste. Furthermore, copper foils are laminated on the upper and lower faces thereof, and bonded under thermocompression at 200 ° C., 55 kg/cm² for 1 hour. Thereafter, a circuit pattern for an outer layer is formed by etching, thus obtaining a printed circuit board of four layers. The printed circuit board of four layers is evaluated. The evaluation results are shown as Board No.1 in Tables 1 to 3 below. A printed circuit board of an arbitrary number of layers can be obtained by repeating the series of processes described above.

EXAMPLE 1

A printed circuit board of four layers is produced in the same manner as in Comparative Example 1, except that a sulfide salt or thiourea is added and mixed with the resin varnish.

The types of the sulfide salt used in this example and the addition amount of the sulfide ions and thiourea are shown as Board Nos. 2 to 17 in Table 1. For each of the four-layer boards, the insulation reliability is tested at 60° C., 95%RH, 15V for 1200 hours. A four-layer board having an insulation resistance value of $1.0 \times 10^{-7}$ Ω or less is classified as a defect, and the defect ratio and the defect occurring time (i.e., the period of time until the first defect occurs) are compared between the boards. The results are shown in Table 1. The addition amount in Table 1 is shown by wt % on the basis of the total weight of the printed circuit board.

TABLE 1

| Board No. | Additive Agent | Addition amount (wt %) | Defect ratio (%) | Defect occurring time (hour) |
| --- | --- | --- | --- | --- |
| 1 (Comparative Ex. 1) | none | 0 | 7 | 100 |
| 2 | sodium sulfide | 1.5 | 12 | 150 |
| 3 | sodium sulfide | 1.2 | 9 | 400 |
| 4 | sodium sulfide | 1.0 | 7 | 1000 |
| 5 | sodium sulfide | 0.7 | 4 | 1000 |
| 6 | sodium sulfide | 0.5 | 0 | — |
| 7 | sodium sulfide | 0.2 | 0 | — |
| 8 | potassium sulfide | 0.5 | 0 | — |
| 9 | ammonium sulfide | 0.5 | 0 | — |
| 10 | thiourea | 0.1000 | 3 | 1000 |
| 11 | thiourea | 0.0800 | 2 | 1000 |
| 12 | thiourea | 0.0500 | 0 | — |
| 13 | thiourea | 0.0300 | 0 | — |
| 14 | thiourea | 0.0100 | 0 | — |
| 15 | thiourea | 0.0050 | 2 | 1000 |
| 16 | thiourea | 0.0010 | 7 | 1000 |
| 17 | thiourea | 0.0005 | 7 | 300 |

EXAMPLE 2

An aramid nonwoven fabric is dipped into an aqueous solution of a sulfide salt or thiourea and dried. Using this base material, a printed circuit board of four layers is produced in the same manner as in Comparative Example 1.

The types of the sulfide salt used in this example and the addition amount of the sulfide ions and thiourea are shown as Board Nos. 18 to 33 in Table 2. For each of the four-layer boards, the insulation reliability is tested at 60° C., 95%RH, 15V for 1200 hours. A four-layer board having an insulation resistance value of $1.0 \times 10^{-7}$ Ω or less is classified as a defect, and the defect ratio and the defect occurring time (i.e., the period of time until the first defect occurs) are compared between the boards. The results are shown in Table 2. The addition amount in Table 2 is shown by wt % on the basis of the total weight of the printed circuit board.

TABLE 2

| Board No. | Additive Agent | Addition amount (wt %) | Defect ratio (%) | Defect occurring time (hour) |
| --- | --- | --- | --- | --- |
| 1 (Comparative Ex. 1) | none | 0 | 7 | 100 |
| 18 | sodium sulfide | 1.5 | 10 | 200 |
| 19 | sodium sulfide | 1.2 | 8 | 400 |
| 20 | sodium sulfide | 1.0 | 5 | 1000 |
| 21 | sodium sulfide | 0.7 | 3 | 1000 |
| 22 | sodium sulfide | 0.5 | 0 | — |
| 23 | sodium sulfide | 0.2 | 0 | — |
| 24 | potassium sulfide | 0.5 | 0 | — |
| 25 | ammonium sulfide | 0.5 | 0 | — |
| 26 | thiourea | 0.1000 | 3 | 1000 |
| 27 | thiourea | 0.0800 | 1 | 1000 |
| 28 | thiourea | 0.0500 | 0 | — |
| 29 | thiourea | 0.0300 | 0 | — |

TABLE 2-continued

| Board No. | Additive Agent | Addition amount (wt %) | Defect ratio (%) | Defect occurring time (hour) |
|---|---|---|---|---|
| 30 | thiourea | 0.0100 | 0 | — |
| 31 | thiourea | 0.0050 | 2 | 1000 |
| 32 | thiourea | 0.0010 | 5 | 1000 |
| 33 | thiourea | 0.0005 | 7 | 400 |

EXAMPLE 3

A printed circuit board of two layers produced in the same manner as in Comparative Example 1 is dipped into an aqueous solution of a sulfide salt or thiourea, and dried. Next, the prepreg is previously subjected to a via processing at a predetermined portion by a carbon dioxide laser, and the via holes are filled with the conductive paste as described in Comparative Example 1. The printed circuit board is sandwiched by the prepreg having the via holes filled with the conductive paste, and copper foils are laminated on the upper and lower faces thereof. Then, the thermocompression is performed under the same conditions as in Comparative Example 1. Thereafter, a circuit pattern for an outer layer is formed by etching, so as to produce a printed circuit board of four layers. A printed circuit board of an arbitrary number of layers can be obtained by repeating the series of processes, and sulfide ions or a sulfur-containing compound are present in an arbitrary layer.

The types of the sulfide salt used in this example and the addition amount of the sulfide ions and thiourea are shown as Board Nos. 34 to 49 in Table 3. For each of the four-layer boards, the insulation reliability is tested at 60° C., 95%RH, 15V for 1200 hours. A four-layer board having an insulation resistance value of $1.0 \times 10^{-7}$ Ω or less is classified as a defect, and the defect ratio and the defect occurring time (i.e., the period of time until the first defect occurs) are compared between the boards. The results are shown in Table 3. The addition amount in Table 3 is shown by wt % on the basis of the total weight of the printed circuit board.

TABLE 3

| Board No. | Additive Agent | Addition amount (wt %) | Defect ratio (%) | Defect occurring time (hour) |
|---|---|---|---|---|
| 1 (Comparative Ex. 1) | none | 0 | 7 | 100 |
| 34 | sodium sulfide | 1.5 | 7 | 300 |
| 35 | sodium sulfide | 1.2 | 7 | 500 |
| 36 | sodium sulfide | 1.0 | 3 | 1000 |
| 37 | sodium sulfide | 0.7 | 1 | 1000 |
| 38 | sodium sulfide | 0.5 | 0 | — |
| 39 | sodium sulfide | 0.2 | 0 | — |
| 40 | potassium sulfide | 0.5 | 0 | — |
| 41 | ammonium sulfide | 0.5 | 0 | — |
| 42 | thiourea | 0.1000 | 2 | 1000 |
| 43 | thiourea | 0.0800 | 1 | 1000 |
| 44 | thiourea | 0.0500 | 0 | — |
| 45 | thiourea | 0.0300 | 0 | — |
| 46 | thiourea | 0.0100 | 0 | — |
| 47 | thiourea | 0.0050 | 1 | 1000 |
| 48 | thiourea | 0.0010 | 3 | 1000 |
| 49 | thiourea | 0.0005 | 7 | 400 |

Comparative Example 2

A glass woven fabric (manufactured by Nitto Boseki Co., Ltd.) as the base material is impregnated with a resin varnish containing 30 parts of brominated bisphenol A type epoxy resin, 35 parts of trifunctional epoxy region, 30 parts of novolac type phenol resin, 0.1 parts of carbonyldiimidazole, and 67 parts of methyl ethyl ketone, and dried so as to form a prepreg. The amount of the resin to be impregnated is 50±1 wt % on the basis of the total weight of the prepreg, and the drying is performed at 140° C. for 3 minutes. Then, the prepreg is sandwiched by copper foils, and pressed by a hot press under vacuum at 200° C., 55 kg/cm² for 1 hour. Thereafter, a circuit pattern for an inner layer is formed by etching, thus producing a double face plate. Then, the double face plate is sandwiched by the prepreg, and copper foils are laminated on the upper and lower faces thereof, and bonded under thermocompression under the above-mentioned conditions. Then, in order to ensure electrical conductivity between the inner layer circuit and an outer layer circuit, a penetrating hole is formed at a desired portion by a drill or the like, and plated with copper. Finally, a circuit pattern for the outer layer is formed by etching, thus obtaining a printed circuit board of four layers. The evaluation results are shown as Board No. 98 in Tables 4 to 6.

EXAMPLE 4

A printed circuit board of four layers is produced in the same manner as in Comparative Example 2, except that a sulfide salt or thiourea is added and mixed to the resin varnish.

The types of the sulfide salt used in this example and the addition amount of the sulfide ions and thiourea are shown as Board Nos. 50 to 65 in Table 4. For each of the four-layer boards, the insulation reliability is tested at 60° C., 95%RH, 15V for 1200 hours. A four-layer board having an insulation resistance value of $1.0 \times 10^{-7}$ Ω or less is classified as a defect, and the defect ratio and the defect occurring time (i.e., the period of time until the first defect occurs) are compared between the boards. The results are shown in Table 4. The addition amount in Table 4 is shown by wt % on the basis of the total weight of the printed circuit board.

TABLE 4

| Board No. | Additive Agent | Addition amount (wt %) | Defect ratio (%) | Defect occurring time (hour) |
|---|---|---|---|---|
| 98 (Comparative Ex. 2) | none | 0 | 5 | 300 |
| 50 | sodium sulfide | 1.5 | 5 | 500 |
| 51 | sodium sulfide | 1.2 | 4 | 500 |
| 52 | sodium sulfide | 1.0 | 2 | 1000 |
| 53 | sodium sulfide | 0.7 | 1 | 1000 |
| 54 | sodium sulfide | 0.5 | 0 | — |
| 55 | sodium sulfide | 0.2 | 0 | — |
| 56 | potassium sulfide | 0.5 | 0 | — |
| 57 | ammonium sulfide | 0.5 | 0 | — |
| 58 | thiourea | 0.1000 | 2 | 1000 |
| 59 | thiourea | 0.0800 | 2 | 1000 |
| 60 | thiourea | 0.0500 | 0 | — |
| 61 | thiourea | 0.0300 | 0 | — |
| 62 | thiourea | 0.0100 | 0 | — |
| 63 | thiourea | 0.0050 | 1 | 1000 |
| 64 | thiourea | 0.0010 | 2 | 1000 |
| 65 | thiourea | 0.0005 | 5 | 500 |

EXAMPLE 5

A glass woven fabric as the base material is dipped into an aqueous solution of a sulfide salt or thiourea, and dried. Using this base material, a printed circuit board of four layers is produced in the same manner as in Comparative Example 2.

The types of the sulfide salt used in this example and the addition amount of the sulfide ions and thiourea are shown as Board Nos. 66 to 81 in Table 5. For each of the four-layer boards, the insulation reliability is tested at 60° C., 95%RH, 15V for 1200 hours. A four-layer board having an insulation resistance value of $1.0 \times 10^{-7}$ Ω or less is classified as a defect, and the defect ratio and the defect occurring time (i.e., the period of time until the first defect occurs) are compared between the boards. The results are shown in Table 5. The addition amount in Table 5 is shown by wt % on the basis of the total weight of the printed circuit board.

TABLE 5

| Board No. | Additive Agent | Addition amount (wt %) | Defect ratio (%) | Defect occurring time (hour) |
|---|---|---|---|---|
| 98 Comparative Ex. 2) | none | 0 | 5 | 300 |
| 66 | sodium sulfide | 1.5 | 5 | 500 |
| 67 | sodium sulfide | 1.2 | 4 | 500 |
| 68 | sodium sulfide | 1.0 | 3 | 1000 |
| 69 | sodium sulfide | 0.7 | 1 | 1000 |
| 70 | sodium sulfide | 0.5 | 0 | — |
| 71 | sodium sulfide | 0.2 | 0 | — |
| 72 | potassium sulfide | 0.5 | 0 | — |
| 73 | ammonium sulfide | 0.5 | 0 | — |
| 74 | thiourea | 0.1000 | 1 | 1000 |
| 75 | thiourea | 0.0800 | 1 | 1000 |
| 76 | thiourea | 0.0500 | 0 | — |
| 77 | thiourea | 0.0300 | 0 | — |
| 78 | thiourea | 0.0100 | 0 | — |
| 79 | thiourea | 0.0050 | 1 | 1000 |
| 80 | thiourea | 0.0010 | 2 | 1000 |
| 81 | thiourea | 0.0005 | 5 | 500 |

EXAMPLE 6

A printed circuit board of two layers produced in the same manner as described in Comparative Example 2 is dipped into an aqueous solution of a sulfide salt or thiourea, and dried. Next, the printed circuit board is sandwiched by the prepreg as described in Comparative Example 2, and copper foils are laminated on the upper and lower faces thereof Then, the thermocompression is performed under the same conditions as in Comparative Example 2. Thereafter, in order to ensure electrical conductivity between an inner layer circuit and an outer layer circuit, a penetrating hole is formed at a desired portion by a drill, and is plated with copper. Finally, a circuit pattern for the outer layer is formed by etching, so as to produce a printed circuit board of four layers.

The types of the sulfide salt used in this example and the addition amount of the sulfide ions and thiourea are shown as Board Nos. 82 to 97 in Table 6. For each of the four-layer boards, the insulation reliability is tested at 60° C., 95%RH, 15V for 1200 hours. A four-layer board having an insulation resistance value of $1.0 \times 10^{-7}$ Ω or less is classified as a defect, and the defect ratio and the defect occurring time (i.e., the period of time until the first defect occurs) are compared between the boards. The results are shown in Table 6. The addition amount in Table 6 is shown by wt % on the basis of the total weight of the printed circuit board.

TABLE 6

| Board No. | Additive Agent | Addition amount (wt %) | Defect ratio (%) | Defect occurring time (hour) |
|---|---|---|---|---|
| 98 Comparative Ex. 2) | none | 0 | 5 | 300 |
| 82 | sodium sulfide | 1.5 | 10 | 500 |
| 83 | sodium sulfide | 1.2 | 7 | 500 |
| 84 | sodium sulfide | 1.0 | 5 | 1000 |
| 85 | sodium sulfide | 0.7 | 2 | 1000 |
| 86 | sodium sulfide | 0.5 | 0 | — |
| 87 | sodium sulfide | 0.2 | 0 | — |
| 88 | potassium sulfide | 0.5 | 0 | — |
| 89 | ammonium sulfide | 0.5 | 0 | — |
| 90 | thiourea | 0.1000 | 2 | 1000 |
| 91 | thiourea | 0.0800 | 1 | 1000 |
| 92 | thiourea | 0.0500 | 0 | — |
| 93 | thiourea | 0.0300 | 0 | — |
| 94 | thiourea | 0.0100 | 0 | — |
| 95 | thiourea | 0.0050 | 1 | 1000 |
| 96 | thiourea | 0.0010 | 3 | 1000 |
| 97 | thiourea | 0.0005 | 5 | 500 |

The results shown in Tables 1 to 6 in connection with Examples 1 to 6 indicate that Board Nos. 5 to 15, 20 to 32, 36 to 48, 52 to 64, 68 to 80 and 85 to 96 containing sulfide ions or thiourea have smaller defect ratios and significantly longer defect occurring time, compared with the results of Comparative Example 1 or 2. Furthermore, although the defect ratios of Board Nos. 4, 16 and 84 are the same as that of Comparative Example 1 or 2, the defect occurring time thereof is significantly longer. These results indicate that the ion migration can be suppressed effectively by adding sulfide ions or thiourea to the board.

The results for Board Nos. 2, 3, 17 to 19, 33 to 35, 49 to 51, 65 to 67, 81 to 83 and 97 provide smaller effects than the results described above, but still provide an advantage over the results of Comparative Examples 1 and 2 in that the period of time until the first defect occurs is longer. This will be described in details below.

First, the case where sodium sulfide is used for the board will be described. From Tables 1 to 6, it is found out that when the addition amount exceeds 1.0 wt %, the effect of suppressing the ion migration deteriorates. The reason seems to be as follows: when a large amount of ions are added, an ion current between electrodes becomes large. This increases the elution amount of metal ions. However, the board added with a large amount of ions has a longer defect occurring time than the boards added with no ion, so that it is believed that the added ions have the capability of capturing eluted metal. The same results are obtained for potassium sulfide and ammonium sulfide. This indicates that these results depend on the addition amount of sulfide ions, not on which salt is used. Consequently, the addition amount of the sulfide ions is preferably 1.0 wt% or less on the basis of the total weight of the board.

Regarding thiourea, the results seen in Tables 1 to 6 indicate that when thiourea is added in an amount of less than 10 ppm, the effect of delaying the occurrence of the ion migration is not as large. This is because the addition amount of thiourea is so small that the speed of capturing eluted ions becomes low. However, in this case as well, the capability of capturing eluted metal is still maintained. Thus, the addition amount of the thiourea is preferably 10 ppm or more on the basis of the total weight of the board.

As described above, regardless of the base material or the production method, by allowing sulfide ions or thiourea to exist in the insulating layer in the printed circuit board or on the surface of the copper foil pattern in the board, the ion migration can be suppressed effectively. The present invention is not limited to the base material, the impregnated resin, the metal foil and the production methods described in Examples.

As described above, the present invention allows ions for forming a hardly soluble metal salt in combination with the metal ions or a sulfur-containing compound for reacting with the metal ions to exist in the insulating layer in the printed circuit board or on the surface of the metal foil pattern, and thus the metal ions eluted by the application of a voltage and the formation of an electrical path can be captured effectively. Thus, the metal ions are prevented from moving from the anode to the cathode and being precipitated, and thus the printed circuit board excellent in ion migration resistance can be provided.

The invention may be embodied in other forms without departing from the spirit or essential characteristics thereof. The embodiments disclosed in this application are to be considered in all respects as illustrative and not limitative, the scope of the invention is indicated by the appended claims rather than by the foregoing description, and all changes which come within the meaning and range of equivalency of the claims are intended to be embraced therein.

What is claimed is:

1. A printed circuit board comprising insulating layers formed by impregnating a base material with resin, a metal foil pattern formed on a desired layer of the insulating layers, and ions that are suitable for forming a hardly soluble metal salt by combining with free metal ions eluted from a portion of the board, the ions suitable for combining with the free metal ions being present in the insulating layer or on a surface of the metal foil pattern.

2. The printed circuit board according to claim 1, wherein the sulfide ions are supplied from at least one selected from the group consisting of ammonium sulfide, potassium sulfide and sodium sulfide.

3. The printed circuit board according to claim 1, wherein a solubility product of the hardly soluble metal salt in water (at 25° C.) is in the range from $10^{-40}$ to $10^{-10}$.

4. The printed circuit board according to claim 1, wherein an addition amount of a sulfide compound for supplying ions suitable for combining with the free metal ions is in the range from 0.001 wt % to 0.1 wt % on the basis of the total weight of the board.

5. The printed circuit board according to claim 1, wherein the metal foil pattern is formed of at least one metal selected from the group consisting of copper, silver and nickel.

6. The printed circuit board according to claim 1, wherein the base material is at least one selected from the group consisting of a glass woven fabric, a glass nonwoven fabric, an aramid woven fabric, an aramid nonwoven fabric and an aramid film.

7. The printed circuit board according to claim 1, wherein the resin to be impregnated is at least one resin selected from the group consisting of an epoxy resin, a cyanate ester resin, a bismaleimide triazine resin, a polyimide resin, and a polyphenylene oxide (PPO) resin.

8. A printed circuit board comprising insulating layers formed by impregnating a base material with a resin, a metal foil pattern formed on a desired layer of the insulating layers, and a sulfur-containing compound that is suitable for reacting with free metal ions eluted from a portion of the board, the sulfur-containing compound being present in the insulating layer or on a surface of the metal foil pattern.

9. The printed circuit board according to claim 8 wherein the sulfur-containing compound suitable for reacting with the free metal ions is thiourea.

10. The printed circuit board according to claim 8 wherein an addition amount of the sulfur-containing compound suitable for reacting with the free metal ions is in the range from 10 ppm to 10000 ppm.

11. The printed circuit board according to claim 8, wherein the metal foil pattern is formed of at least one metal selected from the group consisting of copper, silver and nickel.

12. The printed circuit board according to claim 8, wherein the base material is at least one selected from the group consisting of a glass woven fabric, a glass nonwoven fabric, an aramid woven fabric, an aramid nonwoven fabric and an aramid film.

13. The printed circuit board according to claim 8, wherein the resin to be impregnated is at least one resin selected from the group consisting of an epoxy resin, a cyanate ester resin, a bismaleimide triazine resin, a polyimide resin, and a polyphenylene oxide (PPO) resin.

* * * * *